(12) United States Patent
Takahashi

(10) Patent No.: US 12,436,433 B2
(45) Date of Patent: Oct. 7, 2025

(54) ELECTRO-OPTICAL DEVICE COMPRISING AN ELECTROSTATIC PROTECTION CIRCUIT PROVIDED AT A WIRING SUBSTRATE AND ELECTRONIC APPARATUS

(71) Applicant: SEIKO EPSON CORPORATION, Tokyo (JP)

(72) Inventor: Nariya Takahashi, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 345 days.

(21) Appl. No.: 17/898,458

(22) Filed: Aug. 29, 2022

(65) Prior Publication Data
US 2023/0068861 A1 Mar. 2, 2023

(30) Foreign Application Priority Data
Aug. 31, 2021 (JP) .................................. 2021-140761

(51) Int. Cl.
*G02F 1/1362* (2006.01)
*G02F 1/1368* (2006.01)

(52) U.S. Cl.
CPC .. *G02F 1/136204* (2013.01); *G02F 1/136286* (2013.01); *G02F 1/1368* (2013.01)

(58) Field of Classification Search
CPC .................................................. G02F 1/1362
See application file for complete search history.

(56) References Cited

U.S. PATENT DOCUMENTS

| | | | |
|---|---|---|---|
| 2013/0286517 A1* | 10/2013 | Tian | H02H 3/20 361/56 |
| 2020/0012161 A1* | 1/2020 | Yoshii | G02F 1/136286 |
| 2020/0373374 A1 | 11/2020 | Park | |
| 2020/0402447 A1 | 12/2020 | An et al. | |
| 2021/0104186 A1* | 4/2021 | Fujikawa | G02F 1/136204 |
| 2022/0310589 A1* | 9/2022 | Peng | H01L 27/0251 |
| 2023/0189594 A1 | 6/2023 | Park | |

FOREIGN PATENT DOCUMENTS

| | | |
|---|---|---|
| JP | 2002-006333 | 1/2002 |
| JP | 2008-009242 | 1/2008 |
| KR | 20200133888 | 12/2020 |
| KR | 20200145928 | 12/2020 |

* cited by examiner

*Primary Examiner* — Paul C Lee
(74) *Attorney, Agent, or Firm* — JCIPRNET

(57) ABSTRACT

In an electro-optical device, a first substrate used in an electro-optical panel is provided with a temperature-detecting element, and a wiring substrate connected to the first substrate is provided with third wiring electrically connected to first wiring of the first substrate, and fourth wiring electrically connected to second wiring of the first substrate. The wiring substrate is provided with an electrostatic protection circuit. The electrostatic protection circuit includes a first electrostatic protection circuit provided inside a driving integrated circuit, and a second electrostatic protection circuit including a capacitance element mounted on the wiring substrate. Accordingly, even when static electricity invades the third wiring and the fourth wiring from a connector side, the surge can be released via the electrostatic protection circuit.

16 Claims, 14 Drawing Sheets

ELECTRO-OPTICAL DEVICE COMPRISING AN ELECTROSTATIC PROTECTION CIRCUIT PROVIDED AT A WIRING SUBSTRATE AND ELECTRONIC APPARATUS

The present application is based on, and claims priority from JP Application Serial Number 2021-140761, filed Aug. 31, 2021, the disclosure of which is hereby incorporated by reference herein in its entirety.

BACKGROUND

1. Technical Field

The present disclosure relates to an electro-optical device provided with a temperature-detecting element, and an electronic apparatus.

2. Related Art

There has been proposed a technology of providing a temperature-detecting element outside the display region of an electro-optical panel in electro-optical devices such as liquid crystal devices, and correcting or otherwise modifying driving conditions based on detection results of the temperature-detecting element (see JP-A-2002-6333). In the electro-optical device described in JP-A-2002-6333, a wiring substrate on which a driving integrated circuit (IC) is mounted is connected to the electro-optical panel, and the temperature-detecting element is electrically connected to the driving IC.

However, in a configuration in which the temperature-detecting element is electrically connected to the driving IC mounted on the wiring substrate, the temperature-detecting element is susceptible to surge or noise via the wiring substrate connected to the electro-optical panel. For example, when static electricity invades the driving IC, the surge caused by static electricity invades the temperature-detecting element.

SUMMARY

In order to solve the problems described above, an aspect of an electro-optical device to which the present disclosure is applied includes: an electro-optical panel provided with a temperature-detecting element, first wiring electrically connected to the temperature-detecting element, and second wiring electrically connected to the temperature-detecting element, and a wiring substrate provided with third wiring electrically connected to the first wiring, fourth wiring electrically connected to the second wiring, and an electrostatic protection circuit.

Another aspect of the electro-optical device to which the present disclosure is applied includes: an electro-optical panel provided with a temperature-detecting element, first wiring electrically connected to the temperature-detecting element, and second wiring electrically connected to the temperature-detecting element, and a wiring substrate provided with third wiring electrically connected to the first wiring, fourth wiring electrically connected to the second wiring, and a driving integrated circuit, wherein the third wiring and the fourth wiring do not overlap the driving integrated circuit in plan view.

The electro-optical device according to the present disclosure is used in electronic apparatuses.

DESCRIPTION OF EXEMPLARY EMBODIMENTS

Figure 1:
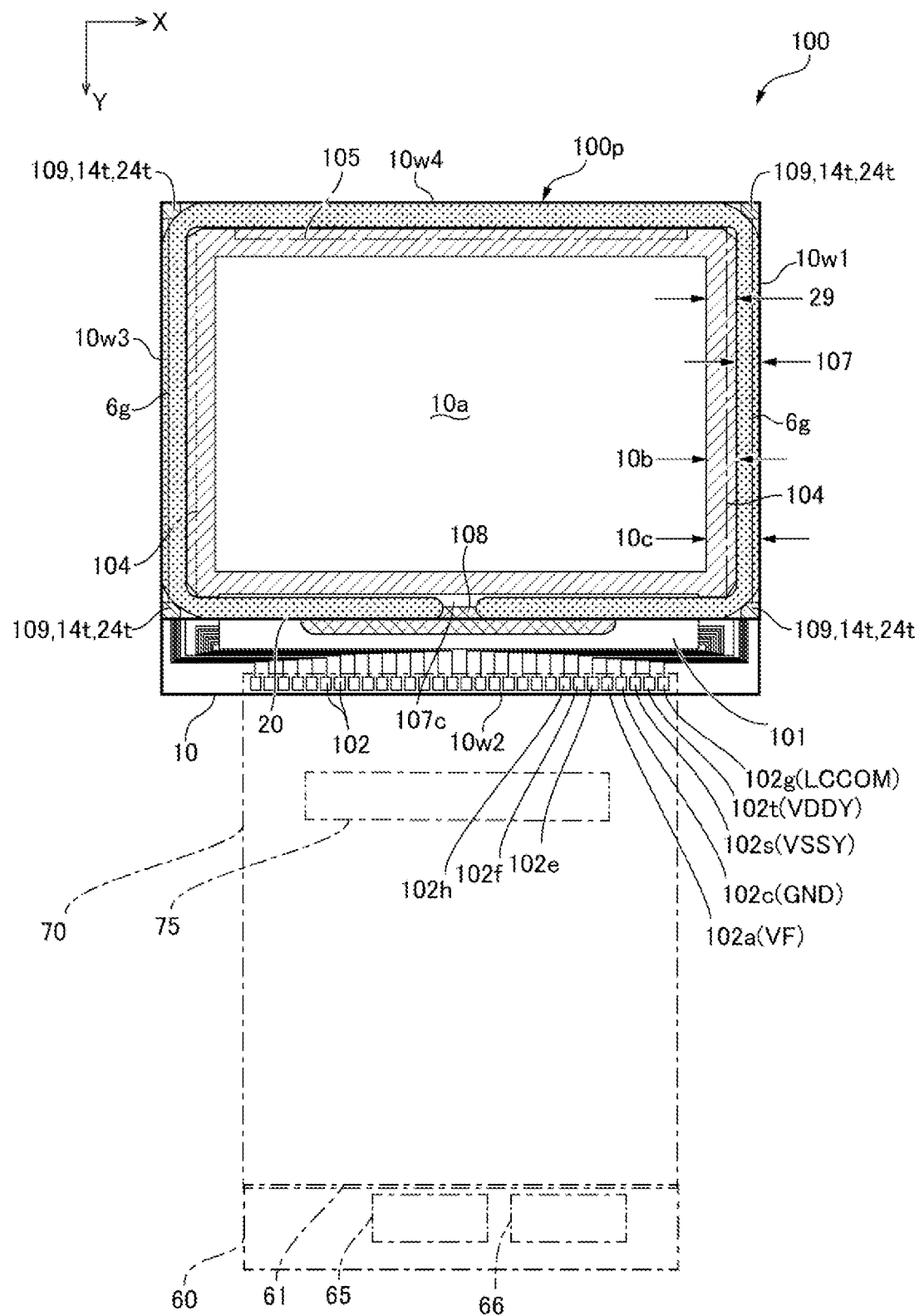
FIG. 1 is a plan view illustrating a configuration example of an electro-optical device according to Embodiment 1 of the present disclosure.

Embodiments of the present disclosure will now be described with reference to the accompanying drawings. Note that in each of the figures referred to in the following description, to illustrate each layer, each member, and the like in a recognizable size in the drawings, each layer, each member, and the like are illustrated at a different scale. Furthermore, a plan view means a state viewed from a normal direction relative to a first substrate 10 or a second substrate 20. Furthermore, in the description, of the two directions intersecting each other in an in-plane direction of the first substrate 10, one is referred to as the first direction Y, and the other is referred to as the second direction X.

1. EMBODIMENTS 1-1. Overall Configuration of Electro-Optical Device 100

Figure 2:
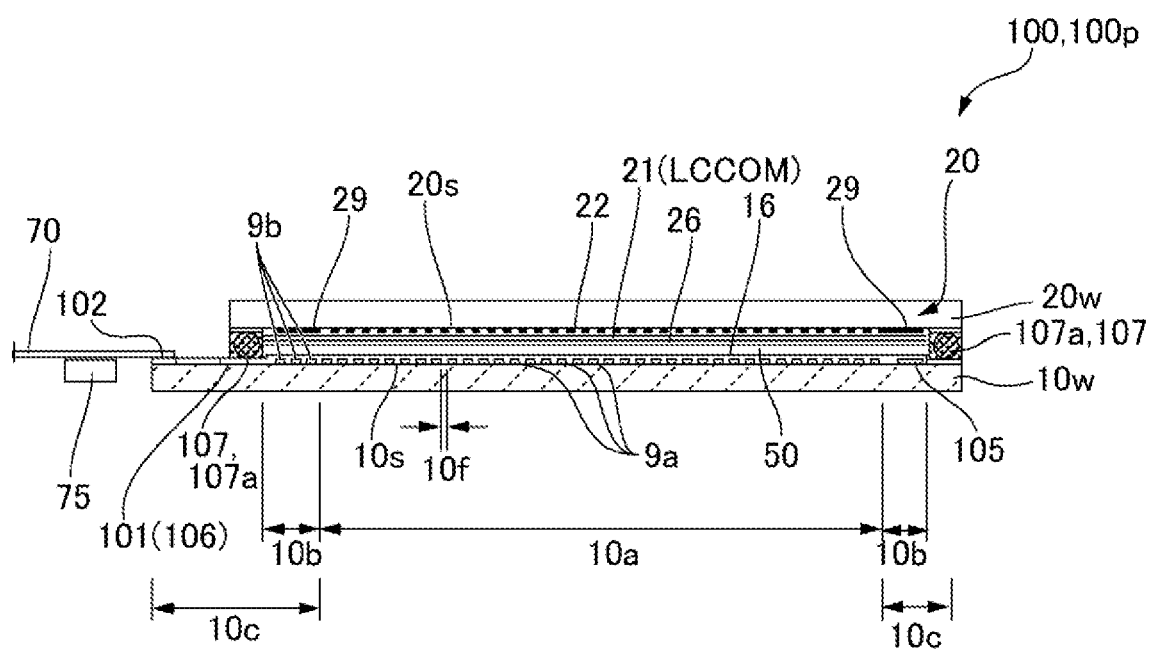
FIG. 2 is an explanatory view schematically illustrating a cross section of the electro-optical device illustrated in FIG. 1.

FIG. 1 is a plan view illustrating a configuration example of an electro-optical device 100 according to Embodiment 1 of the present disclosure. FIG. 2 is an explanatory view schematically illustrating a cross section of the electro-optical device 100 illustrated in FIG. 1. The electro-optical device 100 illustrated in FIGS. 1 and 2 is a liquid crystal device, and includes an electro-optical panel 100p. In the electro-optical device 100, the first substrate 10 and the second substrate 20 are bonded together by a seal material 107 via a predetermined gap between the first substrate 10 and the second substrate 20. The seal material 107 is provided at a frame shape along the outer edge of the second substrate 20. The seal material 107 is an adhesive containing a photocurable resin, a thermosetting resin, or the like. A gap material 107a such as glass fiber or glass beads is blended in the seal material 107 to bring the distance between the first substrate 10 and the second substrate 20 to a predetermined value. In the electro-optical device 100, an electro-optical layer 50 including a liquid crystal layer is provided inside a region surrounded by the seal material 107 in the space between the first substrate 10 and the second substrate 20. In the seal material 107, a cut portion 107c used as a liquid crystal injection port is formed. After a liquid crystal material is injected, such a cut portion 107c is plugged by an encapsulant 108. Note that when the liquid crystal material is filled by a dripping method, the cut portion 107c is not formed. The first substrate 10 and the second substrate 20 are both a quadrangle. In a substantially central portion of the electro-optical device 100, a display region 10a is provided as a quadrangular region. To match such a shape, the seal material 107 is also provided at a substantially quadrangular shape. An outer peripheral region 10c having a quadrangular frame shape is provided outside the display region 10a.

In the following description, in the first substrate 10, a side extending in the first direction Y is referred to as the first side 10w1, and a side adjacent to the first side 10w1 and extending in the second direction X is referred to as the second side 10w2. Furthermore, in the first substrate 10, a side extending in the first direction Y so as to face the first side 10w1 in the second direction X is referred to as the third side 10w3, and a side extending in the second direction X so as to face the second side 10w2 in the first direction Y is referred to as the fourth side 10w4.

In the outer peripheral region 10c of the first substrate 10, a scanning line driving circuit 104 is provided between the first side 10w1 of the first substrate 10 and the display region 10a, and between the third side 10w3 of the first substrate 10 and the display region 10a, respectively. Furthermore, a data line driving circuit 101 is provided between the second side 10w2 of the first substrate 10 and the display region 10a, and an inspection circuit 105 is provided between the fourth side 10w4 of the first substrate 10 and a second side 10a2 of the display region 10a. In the first substrate 10, between the second side 10w2 and the data line driving circuit 101, a plurality of mounting terminals 102 are arranged along the second side 10w2.

The first substrate 10 includes a light-transmitting substrate main body 10w such as a quartz substrate or a glass substrate. On the side of a first surface 10s facing the second substrate 20 of the first substrate 10, a plurality of pixel transistors and pixel electrodes 9a are formed in a matrix pattern in the display region 10a. The pixel electrodes 9a are each electrically connected to a corresponding pixel transistor among the plurality of pixel transistors. A first oriented film 16 is formed on the upper layer side of the pixel electrodes 9a. On the first surface 10s side of the first substrate 10, in a quadrangle frame-shaped region 10b extending between the outer edge of the display region 10a and the seal material 107, dummy pixel electrodes 9b formed simultaneously with the pixel electrodes 9a are formed in a portion extending along the sides of the display region 10a.

The second substrate 20 includes a light-transmitting substrate main body 20w such as a quartz substrate or a glass substrate. On the side of a first surface 20s facing the first substrate 10 of the second substrate 20, a common electrode 21 is formed. A second oriented film 26 is stacked on the surface of the common electrode 21. The common electrode 21 is formed substantially across the entire surface on the first surface 20s side of the second substrate 20. In the frame-shaped region 10b on the first surface 20s side of the second substrate 20, a display end light-blocking region 29 including a light-blocking layer is formed on the lower layer side of the common electrode 21. The inner edge of the display end light-blocking region 29 defines the display region 10a. A light-transmitting flattening film 22 is formed between the display end light-blocking region 29 and the common electrode 21. The light-blocking layer constituting the display end light-blocking region 29 may be formed as a black matrix portion overlapping, in plan view, inter-pixel regions 10f sandwiched between adjacent pixel electrodes 9a. The display end light-blocking region 29 overlaps the dummy pixel electrodes 9b in plan view. The display end light-blocking region 29 is constituted by a light-blocking metal film or black resin.

The first oriented film 16 and the second oriented film 26 are each an inorganic oriented film including a diagonally vapor-deposited film of $SiO_x$ ($x \leq 2$), $TiO_2$, $MgO$, $Al_2O_3$, or the like, and each includes a columnar structure layer in which columnar bodies, referred to as columns, are formed oblique to the first substrate 10 and the second substrate 20. Accordingly, the first oriented film 16 and the second oriented film 26 cause nematic liquid crystal molecules that are used in the electro-optical layer 50 and that have negative dielectric anisotropy to be oriented in an inclined manner oblique to the first substrate 10 and the second substrate 20, thereby causing the liquid crystal molecules to be pre-tilted. In this way, the electro-optical device 100 is constituted as a liquid crystal device of a normally black vertical alignment (VA) mode.

Outside the seal material 107 in the first substrate 10, inter-substrate conduction electrodes 14t are formed in positions overlapping four corner portions 24t of the second substrate 20. The inter-substrate conduction electrodes 14t are conductively connected to common potential wiring 6g. The common potential wiring 6g is conductively connected, of the terminals 102, to a common potential application terminal 102g. An inter-substrate conduction material 109 including conductive particles is disposed between the inter-substrate conduction electrodes 14t and the common electrode 21. The common electrode 21 of the second substrate 20 is electrically connected to the first substrate 10 side via the inter-substrate conduction electrodes 14t and the inter-substrate conduction material 109. Consequently, a common potential LCCOM is applied to the common electrode 21 from the first substrate 10 side.

The electro-optical device 100 of the present embodiment is a transmission-type liquid crystal device. Accordingly, the pixel electrodes 9a and the common electrode 21 are each formed of a light-transmitting conductive film such as an indium tin oxide (ITO) film and an indium zinc oxide (IZO) film. In such a transmission-type liquid crystal device, a light source light incident from the second substrate 20 side is modulated, before being emitted from the first substrate 10, to display an image.

1-2. Electrical Configuration of Electro-Optical Device 100

Figure 3:
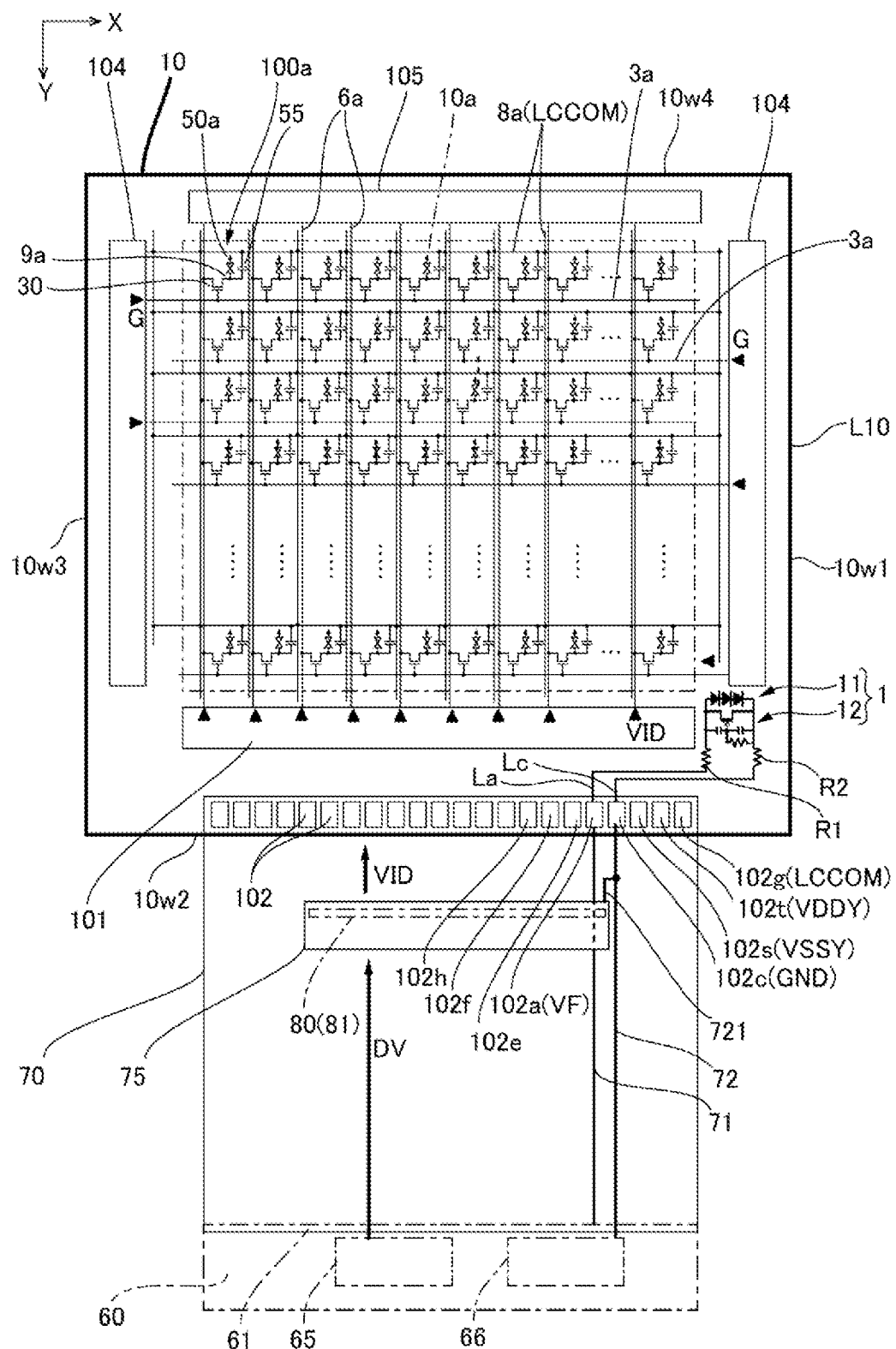
FIG. 3 is a circuit block diagram illustrating the electrical configuration of a first substrate and the like illustrated in FIG. 1.

FIG. 3 is a circuit block diagram illustrating the electrical configuration of the first substrate 10 and the like illustrated in FIG. 1. As illustrated in FIG. 3, in the electro-optical device 100, the first substrate 10 used in the electro-optical panel 100 includes, in a central region thereof, the display region 10a in which a plurality of pixel circuits 100a are arranged in a matrix pattern. Inside the display region 10a, a plurality of scanning lines 3a extending in the second direction X from the scanning line driving circuit 104, and a plurality of data lines 6a extending in the first direction Y from the data line driving circuit 101 are provided. The pixel circuits 100a are formed corresponding to the intersections between the scanning lines 3a and the data lines 6a. The plurality of data lines 6a are electrically connected to the inspection circuit 105. The inspection circuit 105 is a transistor array, in which one of the sources/drains of the transistors are electrically connected to the data lines 6a, the other of the sources/drains are electrically connected to an inspection line (not illustrated), and the gates are electrically connected to control signal wiring.

In each of the plurality of pixel circuits 100a, a pixel transistor 30 including a field effect transistor or the like, and a pixel electrode 9a electrically connected to the pixel transistor 30 are provided. A data line 6a is electrically connected to the source of the pixel transistor 30. A scanning line 3a is electrically connected to the gate of the pixel transistor 30. The pixel electrode 9a is electrically connected to the drain of the pixel transistor 30. Image signals are supplied to the data line 6a. Scanning signals are supplied to the scanning line 3a.

In each of the pixel circuits 100a, the pixel electrode 9a faces the common electrode 21 of the second substrate 20 described above with reference to FIG. 2 via the electro-optical layer 50 to constitute a liquid crystal capacitor 50a. A retention capacitor 55 disposed in parallel with the liquid crystal capacitor 50a is added to each of the pixel circuits 100a to prevent fluctuation of the image signal retained by the liquid crystal capacitor 50a. In the present embodiment, capacitance lines 8a extending across the plurality of pixel circuits 100a are formed in the first substrate 10 to constitute retention capacitors 55. The common potential LCCOM is supplied to the capacitance lines 8a. The capacitance lines 8a are provided so as to overlap at least one of the scanning lines 3a and the data lines 6a. FIG. 3 illustrates an aspect in which the capacitance lines 8a overlap both the scanning lines 3a and the data lines 6a. Although not illustrated, the capacitance lines 8a are electrically connected to the common potential wiring 6g illustrated in FIG. 1.

1-3. Configuration of Wiring Substrate 70 and the Like

Figure 4:
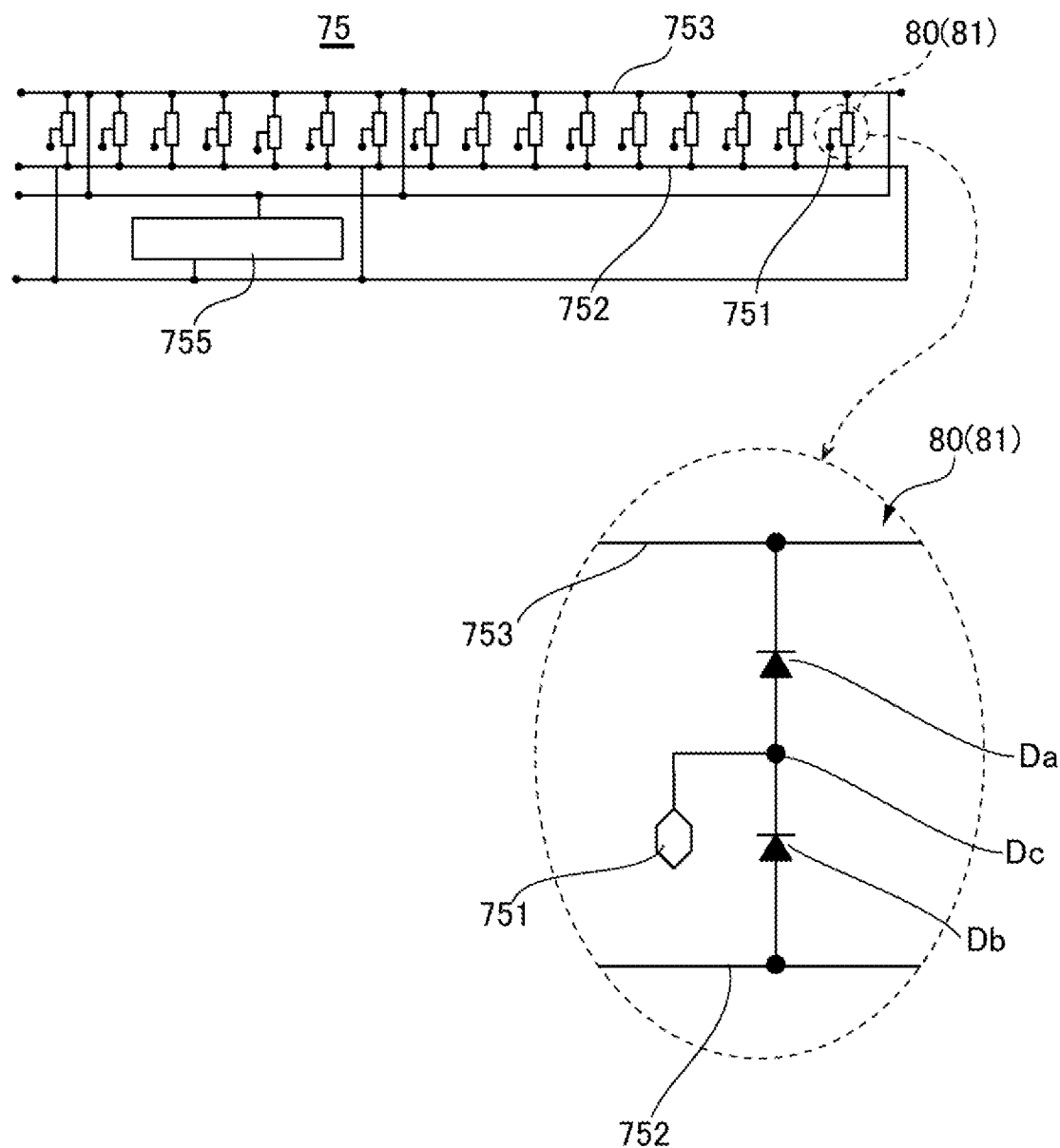
FIG. 4 is an explanatory view of a first electrostatic protection circuit of a driving IC illustrated in FIG. 3.

FIG. 4 is an explanatory view of a first electrostatic protection circuit 81 of a driving IC 75 illustrated in FIG. 3. As illustrated in FIG. 3, a wiring substrate 70 is connected to the terminals 102 of the first substrate 10. In the plurality of terminals 102, for example, terminals 102g, 102t, 102s, a first terminal 102a, a second terminal 102c, and terminals 102e, 102f, and 102h are arranged in this order from the first side 10w1 side toward the third side 10w3 side of the first substrate 10. The terminal 102g is a terminal 102 for supplying the common potential LCCOM. The terminal 102t is a terminal for supplying a high level constant potential VDDY to the scanning line driving circuit 104. The terminal 102s is a terminal for supplying a low level constant potential VSSY to the scanning line driving circuit 104. The terminals 102e and 102f are inspection terminals. The terminal 102h is a terminal for applying a constant potential to the dummy pixel electrodes 9b.

The driving IC 75 that outputs an image signal VID or the like to the electro-optical panel 100p is mounted on the wiring substrate 70. The wiring substrate 70 is electrically connected to an upper circuit 60 via a connector 61. The upper circuit 60 is provided with an image control circuit 65 that outputs image data DV or the like to the driving IC 75. The upper circuit 60 is provided at an upper device of the electro-optical device 100 in an electronic apparatus to be described later. The wiring substrate 70 may be constituted by connecting a plurality of substrates.

In the first substrate 10, a temperature-detecting circuit 1 including a temperature-detecting element 11 is formed outside the display region 10a. Accordingly, the plurality of terminals 102 include the first terminal 102a electrically connected to first wiring La extending from the temperature-detecting circuit 1, and the second terminal 102c electrically connected to second wiring Lc extending from the temperature-detecting circuit 1.

The upper circuit 60 is provided with a temperature detection driving circuit 66 that drives the temperature-detecting circuit 1. Accordingly, the wiring substrate 70 is provided with third wiring 71 electrically connected to the first wiring La via the first terminal 102a, and fourth wiring 72 electrically connected to the second wiring Lc via the second terminal 102c.

An electrostatic protection circuit 80 is provided at the wiring substrate 70. For the electrostatic protection circuit 80, first electrostatic protection circuits 81 provided inside the driving IC 75 is used and, as will be described in Embodiment 2, a second electrostatic protection circuit 82 provided outside the driving IC 75 in the wiring substrate 70 is used.

In the present embodiment, the electrostatic protection circuit 80 is the first electrostatic protection circuits 81 provided inside the driving IC 75, which are electrically connected to at least one of the third wiring 71 and the fourth wiring 72. In the present embodiment, both the third wiring 71 and the fourth wiring 72 are electrically connected to the first electrostatic protection circuits 81.

More specifically, the driving IC 75 overlaps the third wiring 71 in plan view, and the third wiring 71 is electrically connected to a terminal of the driving IC 75. Furthermore, while the driving IC 75 does not overlap the fourth wiring 72 in plan view, the driving IC 75 overlaps wiring 721 branching off from the fourth wiring 72 in plan view. Accordingly, the fourth wiring 72 is electrically connected to a terminal of the driving IC 75 via the wiring 721.

As schematically illustrated in FIG. 4, the first electrostatic protection circuits 81 are connected to a plurality of terminals 751 of the driving IC 75, respectively. In the present embodiment, a first electrostatic protection circuit 81 includes wiring 752 to which the ground potential GND is applied, wiring 753 to which a constant potential Vcc is applied, a diode Da connected in the reverse direction between the wiring 752 and the wiring 753, and a diode Db connected in the reverse direction between the wiring 752 and the diode Da. The first electrostatic protection circuit 81 is electrically connected to a terminal 751 at a connecting site Dc between the diode Da and the diode Db.

The driving IC 75 is provided with a power clamper circuit 755. The first electrostatic protection circuits 81 are electrically connected to the power clamper circuit 755. Basically similar to the first electrostatic protection circuits 81, the power clamper circuit 755 also limits the range of the output voltage to a range from the ground potential GND to the constant potential Vcc by diodes.

As illustrated in FIG. 3, in the electro-optical panel 100p, a first resistor unit R1 is provided at the first wiring La, and a second resistor unit R2 is provided as protective resistance in the second wiring Lc. Here, the resistance value of the first resistor unit R1 is greater than the resistance value of the third wiring 71, and the resistance value of the second resistor unit R2 is greater than the resistance value of the fourth wiring 72.

According to the electro-optical device 100 configured in this way, in a case in which the electro-optical device 100 is handled with the wiring substrate 70 connected to the electro-optical panel 100p, even when static electricity invades the third wiring 71 and the fourth wiring 72 from the connector 61 side, the surge caused by static electricity can be released through the electrostatic protection circuit 80 provided at the wiring substrate 70. More specifically, the surge caused by static electricity invading the third wiring 71 and the fourth wiring 72 can be released via the first electrostatic protection circuits 81 provided as the electrostatic protection circuit 80 in the driving IC 75. Therefore, the temperature-detecting element 11 provided at the electro-optical panel 100p can be protected.

1-4. Configuration of Temperature-Detecting Circuit 1 and the Like

Figure 5:
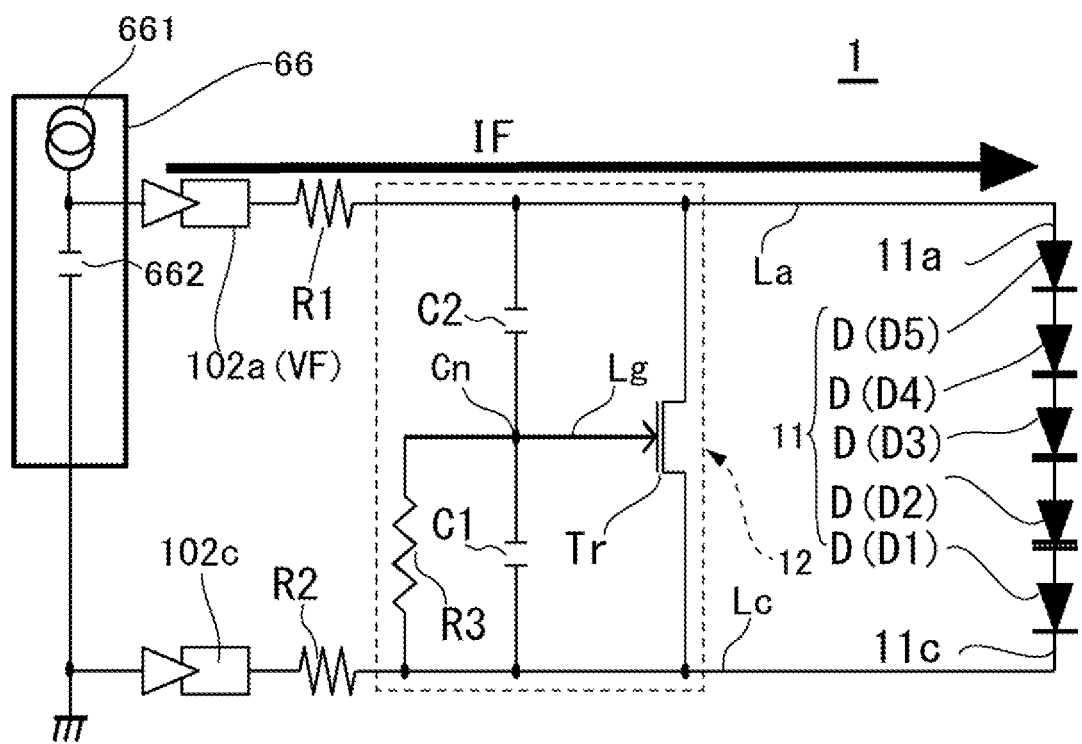
FIG. 5 is an explanatory view of a temperature-detecting circuit illustrated in FIG. 3.

FIG. 5 is an explanatory view of the temperature-detecting circuit 1 illustrated in FIG. 3. As illustrated in FIG. 5, the temperature-detecting circuit 1 includes the temperature-detecting element 11. The temperature-detecting element 11 includes, for example, a plurality of diodes D connected in series to each other. FIG. 5 illustrates an embodiment in which five diodes D are electrically connected in series to each other. Hereinafter, the five diodes D will be each referred to as the first diode D1, the second diode D2, the third diode D3, the fourth diode D4, and the fifth diode D5. The first wiring La extending from the first terminal 102a is electrically connected to the anode 11a of the fifth diode D5 of the temperature-detecting element 11. The second wiring Lc extending from the second terminal 102c is electrically connected to the cathode 11c of the first diode D1 of the temperature-detecting element 11.

Accordingly, when a temperature is detected with the electro-optical device 100 installed in the electronic apparatus, a minute forward driving current IF of approximately 10 nA to a few µA is supplied from the temperature detection driving circuit 66 via the wiring substrate 70 connected to the first substrate 10, and to the five temperature-detecting elements 11 of the temperature-detecting circuit 1 via the first terminal 102a and the second terminal 102c. Here, the forward voltage of the temperature-detecting element 11 varies with an almost linear characteristic relative to the temperature. Consequently, when the voltage between the first terminal 102a and the second terminal 102c is detected, the temperature of the electro-optical panel 100p can be detected. At this time, the temperature-detecting element 11 is disposed in the vicinity of the display region 10a, and thus the temperature-detecting element 11 can appropriately detect the temperature of the display region 10a. Therefore, if the image signal is corrected or otherwise modified based on the temperature detected by the temperature-detecting circuit 1, the electro-optical device 100 can be driven under appropriate conditions corresponding to the temperature of the display region 10a, and thus a high quality image can be displayed.

Note that the temperature detection driving circuit 66 includes a constant current circuit 661, and a stabilizing capacitor 662 between the constant current circuit 661 and the ground. The stabilizing capacitor 662 is electrically connected to wiring electrically connected to the first terminal 102a, and wiring electrically connected to the second terminal 102c. The stabilizing capacitor 662 stabilizes measured values of the output voltage VF. The capacitance of the stabilizing capacitor 662 is, for example, 0.1 µF.

In the temperature-detecting circuit 1, the first resistor unit R1 and the second resistor unit R2 are provided as protective resistance in the first wiring La and the second wiring Lc, respectively. The temperature-detecting circuit 1 includes a third electrostatic protection circuit 12 for protecting the temperature-detecting element 11. The third electrostatic protection circuit 12 includes a transistor Tr connected between the first wiring La and the second wiring Lc. The transistor Tr is electrically connected in parallel to the temperature-detecting element 11. One of the source/drain of the transistor Tr is electrically connected to the first wiring La between the first terminal 102a and the temperature detection element 11. The other of the source/drain of the transistor Tr is electrically connected to the second wiring Lc between the second terminal 102c and the temperature-detecting element 11. In the present embodiment, similar to the pixel transistors 30, the transistor Tr is formed of an N-channel type thin film transistor.

The third electrostatic protection circuit 12 includes a first capacitance element C1 and a second capacitance element C2 electrically connected in series to each other between the first wiring La and the second wiring Lc. More specifically, one end of the first capacitance element C1 is electrically connected to the first wiring La, one end of the second capacitance element C2 is electrically connected to the second wiring Lc, and the other end of the first capacitance element C1 and the other end of the second capacitance element C2 are electrically connected to each other.

In the third electrostatic protection circuit 12, the connecting node Cn between the first capacitance element C1 and the second capacitance element C2 is electrically connected to the gate of the transistor Tr. The third electrostatic protection circuit 12 includes a third resistor unit R3 electrically connected in parallel to the first capacitance element C1. More specifically, gate wiring Lg extending from the gate of the transistor Tr is electrically connected to the connecting node Cn between the first capacitance element C1 and the second capacitance element C2, and is electrically connected to the second wiring Lc via the third resistor unit R3.

In the temperature-detecting circuit 1, the first resistor unit R1 is inserted into the first wiring La between the first terminal 102a and the connecting position between the first wiring La and the first capacitance element C1, and the second resistor unit R2 is inserted into the second wiring Lc between the second terminal 102c and the connecting position between the second wiring Lc and the second capacitance element C2.

In the present embodiment, the size or the like of the circuit elements used in the temperature-detecting circuit 1 is as follows, for example. However, these are not limited to the following conditions.

Transistor Tr has a channel width W of 800 µm, and a channel length L of 5 µm.

The first capacitance element C1 has a capacitance of 5 pF.

The second capacitance element C2 has a capacitance of 5 pF.

The first resistor unit R1 has a resistance value of 10 kΩ.

The second resistor unit R2 has a resistance value of 10 kΩ.

The third resistor unit R3 has a resistance value of 500 kΩ.

In the electro-optical device 100 configured in this way, when a surge current caused by static electricity invades from the first terminal 102a, the third electrostatic protection circuit 12 protects the temperature-detecting element 11 from static electricity. More specifically, in the third electrostatic protection circuit 12, the gate-source voltage of the transistor Tr is 0 V and the transistor Tr is off in a static state.

In contrast, when a surge current caused by static electricity invades from the first terminal 102a, the potential of the gate of the transistor Tr, which is the potential of the connecting node Cn between the first capacitance element C1 and the second capacitance element C2, rises while voltage fluctuation is suppressed by the first resistor unit R1. This brings the transistor Tr into the ON state, and thus the surge current flows to the second terminal 102c via the transistor Tr and the second wiring Lc. At this time, the first resistor unit R1 mitigates the surge current invading from the first terminal 102a, and the second resistor unit R2 mitigates the surge current invading from the second terminal 102c. Furthermore, the period in which the transistor Tr is turned on is determined by the first capacitance element C1, the second capacitance element C2, the third resistor unit R3, the gate capacitance of and the transistor Tr, and the like. After discharging, the potential of the gate of the transistor Tr is returned to the OFF potential by the third resistor unit R3. Thus, the surge current flowing through the temperature-detecting element 11 is suppressed by the third electrostatic protection circuit 12, and thus the temperature-detecting element 11 can be protected. Note that the first resistor unit R1 and the second resistor unit R2 cause a voltage drop of the temperature-detecting element 11 due to the driving current IF. However, the driving current IF is extremely small, and thus the impact of the voltage drop due to the first resistor unit R1 and the second resistor unit R2 is almost negligible.

1-5. Layout and the Like of Temperature-Detecting Circuit 1 and the Like

Figure 6:
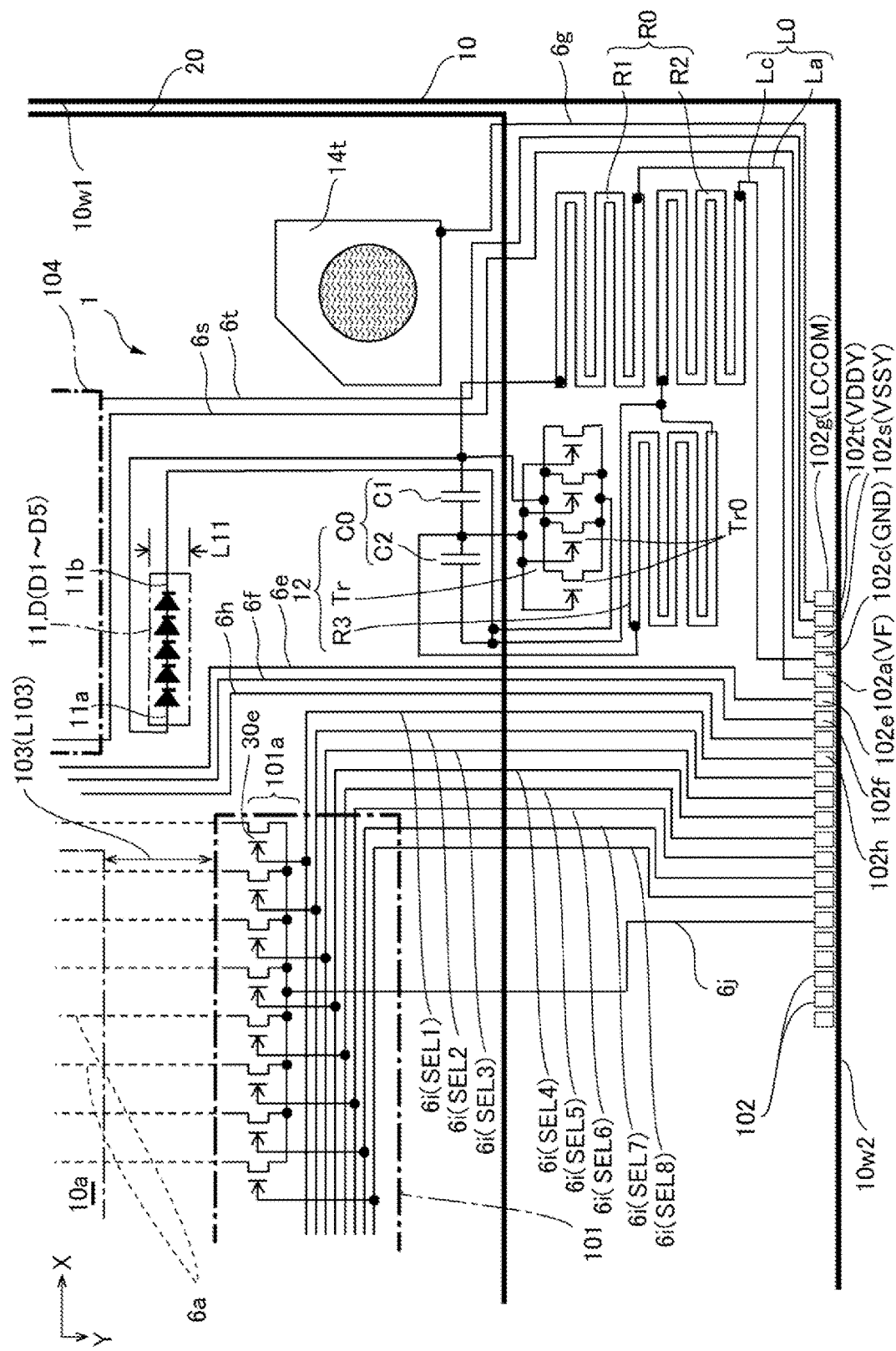
FIG. 6 is an explanatory view illustrating a planar configuration of the temperature-detecting circuit and the like illustrated in FIG. 5.

FIG. 6 is an explanatory view illustrating a planar configuration of the temperature-detecting circuit 1 and the like illustrated in FIG. 5. Note that FIG. 6 illustrates a case in which five diodes D are electrically connected in series to each other in the temperature-detecting element 11. As illustrated in FIG. 6, the first substrate 10 includes the scanning line driving circuit 104 disposed along the first direction Y between the display region 10a and the first side 10w1. The inter-substrate conduction electrode 14t for establishing conduction between the first substrate 10 and the second substrate 20 is provided between the scanning line driving circuit 104 and the second side 10w2.

Furthermore, the first substrate 10 includes the data line driving circuit 101 disposed along the second direction X between the display region 10a and the second side 10w2. The plurality of data lines 6a extend in the first direction Y from the data line driving circuit 101, and are electrically connected to the pixel circuits 100a of the display region 10a described above with reference to FIG. 3. Accordingly, the space between the data line driving circuit 101 and the display region 10a represents a wiring region 103 in which the plurality of data lines 6a extend from the data line driving circuit 101 to the display region 10a.

In the present embodiment, a selection circuit 101a that constitutes a demultiplexer is provided at an end portion closest to the display region 10a of the data line driving circuit 101. The data lines 6a extend along the first direction Y from the selection circuit 101a toward the display region 10a. The selection circuit 101a includes transistors 30e that control electrical connecting between the data lines 6a and image signal wiring 6j. In the present embodiment, the demultiplexer includes, for example, eight selection circuits 101a. In such a data line driving circuit 101, the image signal VID is supplied from the driving IC 75 illustrated in FIG. 3 via a terminal 102 and the image signal wiring 6j. At this time, the transistors 30e of the selection circuit 101a supply the image signal VID to each of the data lines 6a in a time division manner based on selection signals SEL1, SEL2, . . . , and SEL8 supplied from the driving IC 75 via control signal wiring 6i.

The temperature-detecting element 11 is provided at the first direction Y relative to the scanning line driving circuit 104. More specifically, the temperature-detecting element 11 is disposed so as to be adjacent to the scanning line driving circuit 104 in the first direction Y between the scanning line driving circuit 104 and the second side 10w2. Furthermore, the temperature-detecting element 11 is arranged so as to be adjacent to the data line driving circuit 101 or the wiring region 103 in the second direction X. In the present embodiment, the temperature-detecting element 11 is disposed so as to be adjacent to the wiring region 103 in the direction along the second direction X on the first side 10w1 side. Here, the plurality of diodes D constituting the temperature-detecting element 11 are arranged in a constant direction. In the present embodiment, the plurality of diodes D constituting the temperature-detecting element 11 are arranged in the second direction X. Accordingly, the dimension L11 in the first direction Y of the temperature-detecting element 11 is smaller than the dimension L103 in the first direction Y of the wiring region 103.

According to such a configuration, the temperature-detecting element 11 can be disposed near the display region 10a. Accordingly, the temperature of the electro-optical layer 50 of the display region 10a can be appropriately detected. Furthermore, the temperature-detecting element 11 and wiring L0 (the first wiring La and the second wiring Lc) electrically connected to the temperature-detecting element 11 can be separated from the scanning lines 3a, and thus the impact of noise from the scanning lines 3a on the wiring L0 can be reduced. Therefore, the temperature-detecting element 11 has high detection accuracy.

In the present embodiment, as will be described below, the first wiring La and the second wiring Lc are collectively drawn around as the wiring line L0 electrically connected to the third electrostatic protection circuit 12. The first resistor unit R1 and the second resistor unit R2 are collectively disposed as a resistor unit R0 electrically connected to the wiring L0. Note that in electrically connecting the first wiring La to the first terminal 102a and electrically connecting the second wiring Lc to the second terminal 102c, a multilayer wiring structure is utilized to cause the first wiring La and the second wiring Lc to intersect each other while ensuring insulation.

The entire third electrostatic protection circuit 12 is collectively disposed. Accordingly, the first capacitance element C1 and the second capacitance element C2 are collectively disposed as a capacitance element C0 of the third electrostatic protection circuit 12. The capacitance element C0, the transistor Tr, and the third resistor unit R3 are collectively disposed.

More specifically, the third electrostatic protection circuit 12 is collectively disposed between an inter-substrate conduction electrode 14t and the second side 10w2. In the present embodiment, when viewed from a direction along the first direction Y, the third electrostatic protection circuit 12 is disposed at a position displaced from the inter-substrate conduction electrode 14t to a side opposite to the first side 10w1 in the direction along the second direction X. When viewed from the direction along the second direction X, the third electrostatic protection circuit 12 is provided between the inter-substrate conduction electrode 14t and the second side 10w2. In the present embodiment, the capacitance element C0 (the first capacitance element C1 and the second capacitance element C2), the transistor Tr, and the third resistor unit R3 that constitute the third electrostatic protection circuit 12 are disposed so as to be aligned in this order from the inter-substrate conduction electrode 14*t* side toward the second side 10*w*2 side. Furthermore, in the capacitance element C0, the first capacitance element C1 and the second capacitance element C2 are disposed so as to be aligned in the direction along the second direction X.

In the present embodiment, the first capacitance element C1 is disposed on the first side 10*w*1 side relative to the second capacitance element C2. Accordingly, the third electrostatic protection circuit 12 can be disposed within a narrow range in the second direction X, and thus the presence of the third electrostatic protection circuit 12 does not affect the layout of the wiring much.

In the transistor Tr, an integrally formed semiconductor layer is utilized to form a plurality of unit transistor elements Tr0. The plurality of unit transistor elements Tr0 are electrically connected in parallel to each other to form the transistor Tr. Note that FIG. 6 illustrates an aspect in which the plurality of unit transistor elements Tr0, which are four in total, are electrically connected in parallel to each other. However, the number of unit transistor elements Tr0 electrically connected in parallel to each other is not limited to four.

In the wiring L0 electrically connected to the third electrostatic protection circuit 12, the resistor unit R0 is also provided between the inter-substrate conduction electrode 14*t* and the second side 10*w*2. More specifically, the resistor unit R0 is disposed between the third electrostatic protection circuit 12 and the first side 10*w*1. In the present embodiment, the wiring L0 includes the first wiring La and the second wiring Lc electrically connected to the temperature-detecting element 11. The resistor unit R0 includes the first resistor unit R1 electrically connected to the first wiring La, and the second resistor unit R2 electrically connected to the second wiring Lc. The first resistor unit R1 and the second resistor unit R2 are disposed so as to be aligned in the first direction Y between the third electrostatic protection circuit 12 and the first side 10*w*1.

In this way, the third electrostatic protection circuit 12 is disposed between the inter-substrate conduction electrode 14*t* and the second side. In the wiring line L0, the resistor unit R0 is disposed between the third electrostatic protection circuit 12 and the first side 10*w*1. Accordingly, the resistor unit R0 can be disposed in a narrow range in the second direction X, and thus the presence of the resistor unit R0 does not affect the layout of the wiring much. Furthermore, the resistor unit R0 can be disposed, of the space that separates the resistor unit R0 from the terminals 102, in a free space near the first side 10*w*1, and thus the presence of the resistor unit R0 does not affect the layout of the wiring much. Therefore, it is possible to prevent increase in size of the electro-optical device 100.

In the electro-optical device 100 configured in this way, the first substrate 10 includes first constant potential wiring 6*h* extending in the first direction Y at a position adjacent to the temperature-detecting element 11 on the side opposite to the first side 10*w*1. The first constant potential wiring 6*h* is, for example, constant potential wiring for supplying the common potential LCCOM to the dummy pixel electrodes 9*b* illustrated in FIG. 2. The first substrate 10 includes inspection wiring 6*e* and 6*f* that extend in the first direction Y between the first constant potential wiring 6*h* and the temperature-detecting element 11 and that reach the inspection circuit 105. In the present embodiment, the first constant potential wiring 6*h* extends in the second direction X between the data line driving circuit 101 and the third electrostatic protection circuit 12, and between the wiring region 103 and the temperature-detecting element 11.

The first substrate 10 includes second constant potential wiring 6*s* extending in the second direction X between the temperature-detecting element 11 and the scanning line driving circuit 104. The second constant potential wiring 6*s* is constant potential wiring for supplying the low level constant potential VSSY to the scanning line driving circuit 104. After passing between the first resistor unit R1 and the first side 10*w*1 from the terminal 102*s*, the second constant potential wiring 6*s* extends in the second direction X between the temperature-detecting element 11 and the scanning line driving circuit 104, and further extends in the first direction Y toward the scanning line driving circuit 104. Accordingly, the first constant potential wiring 6*h* and the second constant potential wiring 6*s* can be utilized as shields, and thus the temperature-detecting element 11 is less susceptible to noise from signal lines such as data lines 6*a* and the like.

Note that constant potential wiring 6*t* that supplies the high level constant potential VDDY to the scanning line driving circuit 104 and common potential wiring 6*g* that supplies the constant potential LCCOM to the inter-substrate conduction electrode 14*t* are provided at the first side 10*w*1 side of the second constant potential wiring 6*s*. The common potential wiring 6*g* is electrically connected to the capacitance lines 8*a* by the multilayer wiring structure. Capacitance lines 8*a* are also used outside the display region 10*a* as wiring having a relatively wide width to block light or as a shield.

1-6. Configuration Example of Temperature-Detecting Element 11

Figure 7:
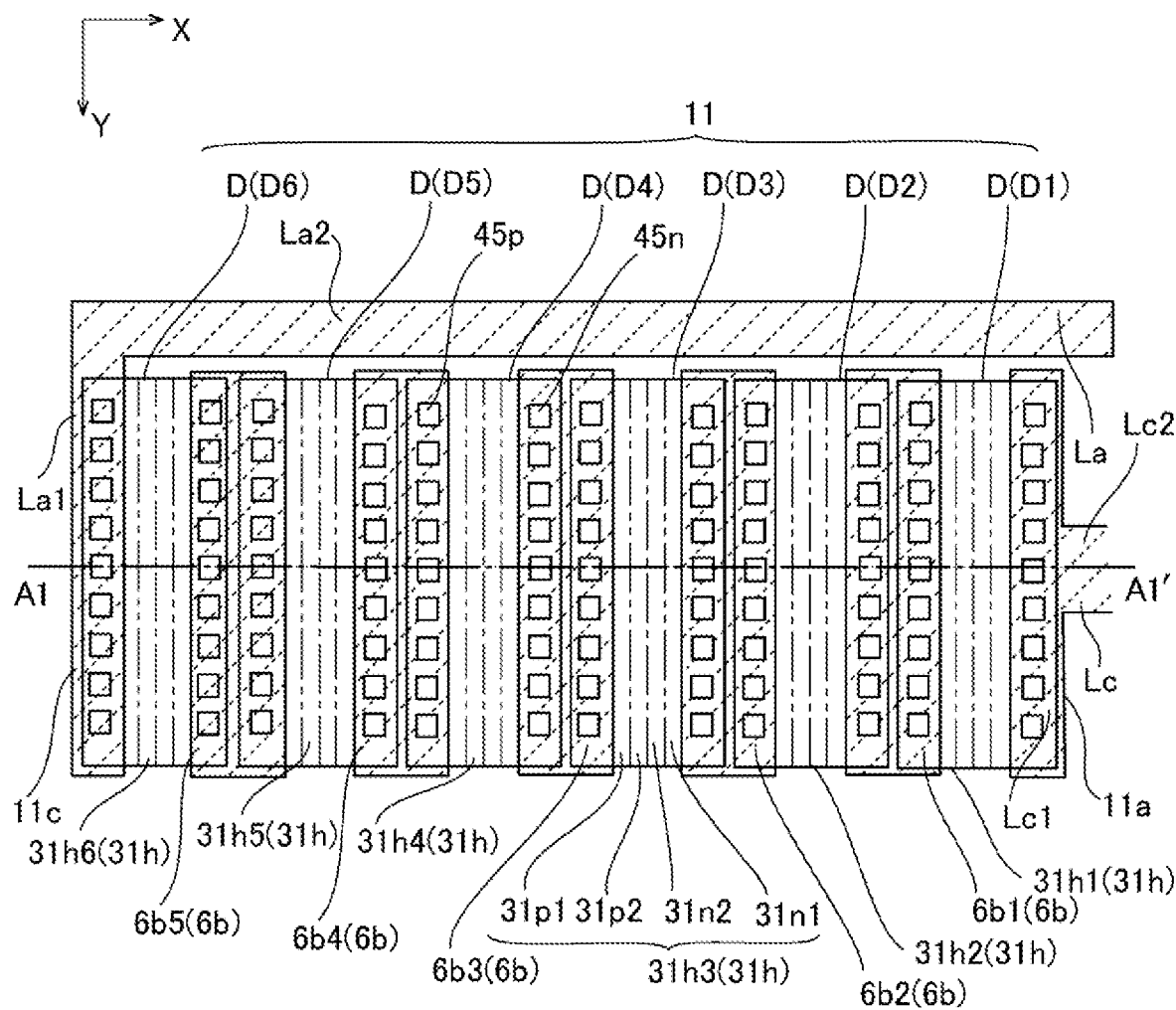
FIG. 7 is a plan view schematically illustrating a planar configuration of the temperature-detecting element illustrated in FIG. 5.
Figure 8:
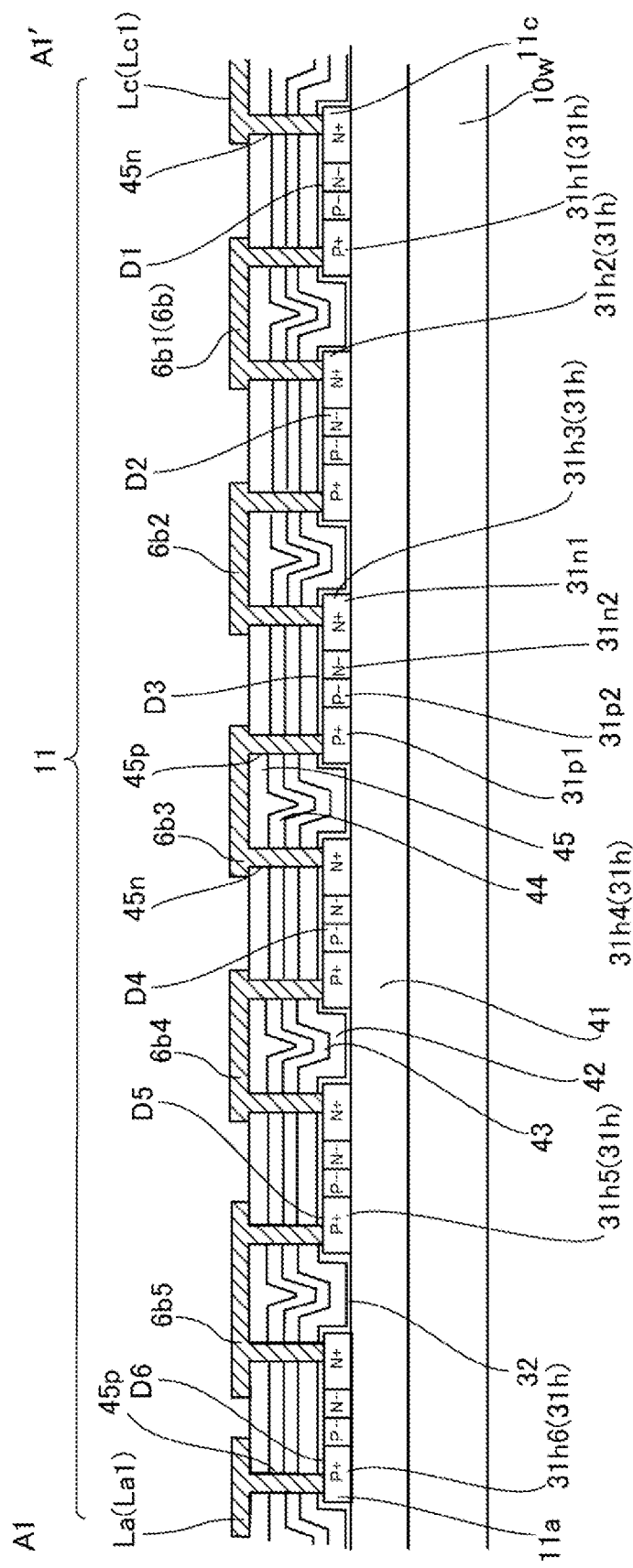
FIG. 8 is a cross-sectional view schematically illustrating a cross section of the temperature-detecting element illustrated in FIG. 7.

FIG. 7 is a plan view schematically illustrating a planar configuration of the temperature-detecting elements illustrated in FIG. 5. FIG. 8 is a cross-sectional view schematically illustrating a cross section of the temperature-detecting elements illustrated in FIG. 7. FIG. 8 corresponds to a cross section taken along the line A1-A1' in FIG. 7. FIGS. 7 and 8 illustrate a case in which six diodes D are electrically connected in series to each other in the temperature-detecting element 11. Note that in FIGS. 7 and 8, of the N-type regions and the P-type regions provided at a semiconductor layer 31*h* that constitute the temperature-detecting element 11, one corresponds to first impurity regions of a first conductivity type, and the other corresponds to second impurity regions of a second conductivity type. In the present embodiment, of the N-type regions and the P-type regions provided at the semiconductor layer 31*h*, the N-type regions correspond to the first impurity regions, and the P-type regions correspond to the second impurity regions. Furthermore, in FIG. 8, illustration of a layer or the like on the upper layer side of the temperature-detecting element 11 formed in the first substrate 10 is omitted to the extent that such omission does not affect the description.

In the present embodiment, in forming the temperature-detecting element 11 illustrated in FIG. 5, a plurality of semiconductor layers 31*h* separated from each other in an island shape are arranged in a constant direction as illustrated in FIGS. 7 and 8. The plurality of semiconductor layers 31*h* are used to form diodes D. In the present embodiment, six semiconductor layers 31*h*1 to 31*h*6 are arranged in the second direction X as a constant direction, and the six semiconductor layers 31*h* are used to form six diodes D.

More specifically, in each of the six semiconductor layers 31*h*, N-type regions and P-type regions are disposed aligned in the second direction X. In the present embodiment, the N-type regions include high concentration N-type regions 31$n$1 and low concentration N-type regions 31$n$2, and the P-type regions include high concentration P-type regions 31$p$1 and low concentration P-type regions 31$p$2. The connecting portion between a low concentration N-type region 31$n$2 and a low concentration P-type region 31$p$2 constitutes a PN junction surface. Note that the configuration of the junction surface is not limited to this configuration.

In this way, the plurality of semiconductor layers 31$h$ are arranged so as to be aligned in the second direction X, and thus even when the number of diodes D electrically connected in series to each other is to be increased, space constraints are not likely to be an issue. Furthermore, the plurality of semiconductor layers 31$h$ are arranged so as to be aligned in the second direction X, and thus the dimension L11 in the first direction Y of the temperature-detecting element 11 can be smaller than the dimension L103 in the first direction Y of the wiring region 103. Therefore, the entire temperature-detecting element 11 can be disposed near the display region 10$a$.

Relay electrodes 6$b$ that electrically connect the diodes D are formed in an upper layer of an insulating film 45. In the present embodiment, the five relay electrodes 6$b$1 to 6$b$5 are each electrically connected to a high concentration P-type region 31$p$1 of a semiconductor layer 31$h$ and a high concentration N-type region 31$n$1 of an adjacent semiconductor layer 31$h$ via contact holes 45$p$ and 45$n$ that penetrate a gate insulating film 32 and insulating films 42, 43, 44, and 45. Furthermore, of the semiconductor layers 31$h$, the two semiconductor layers 31$h$ located at both ends are electrically connected to the first wiring La and the second wiring Lc, respectively, via the contact holes 45$p$ and 45$n$ that penetrate the gate insulating film 32 and the insulating films 42, 43, 44, and 45.

In the present embodiment, the first wiring La includes a first connecting portion La1 extending in the first direction Y, and a first extending portion La2 extending in the second direction X from an end portion of the first connecting portion La1. The first connecting portion La1 is electrically connected to one electrode of the temperature-detecting element 11. The second wiring Lc includes a second connecting portion Lc1 extending in the first direction Y, and a second extending portion Lc2 extending in the second direction X from the second connecting portion Lc1. The second connecting portion Lc1 is electrically connected to the other electrode of the temperature-detecting element 11. In the present embodiment, one electrode of the temperature-detecting element 11 is the anode 11$a$, and the other electrode of the temperature-detecting element 11 is the cathode 11$c$.

The first wiring La, the second wiring Lc, and the relay electrodes 6$b$ are wiring formed in the same layer as the data lines 6$a$, as are the first constant potential wiring 6$h$, the second constant potential wiring 6$s$, the constant potential wiring 6$i$, the common potential wiring 6$g$, the control signal wiring 6$i$, and the image signal wiring 6$j$ illustrated in FIG. 6. The first wiring La, the second wiring Lc, and the relay electrodes 6$b$ are low resistance wiring mainly composed of aluminum.

In the temperature-detecting element 11, the plurality of semiconductor layers 31$h$ include N-type regions and P-type regions between, of the plurality of relay electrodes 6$b$, a relay electrode 6$b$ adjacent to the first connecting portion La1 and the first connecting portion La1, and include N-type regions and P-type regions between, of the plurality of relay electrodes 6$b$, a relay electrode 6$b$ adjacent to the second connecting portion Lc1 and the second connecting portion Lc1. Furthermore, the plurality of semiconductor layers 31$h$ include N-type regions and P-type regions between, of the plurality of relay electrodes 6$b$, two relay electrodes 6$b$ adjacent to each other. That is, the relay electrodes 6$b$ have a narrow width in the second direction X. Accordingly, the parasitic capacitance between the relay electrodes 6$b$ and a noise source is small.

2. EMBODIMENT 2

Figure 9:
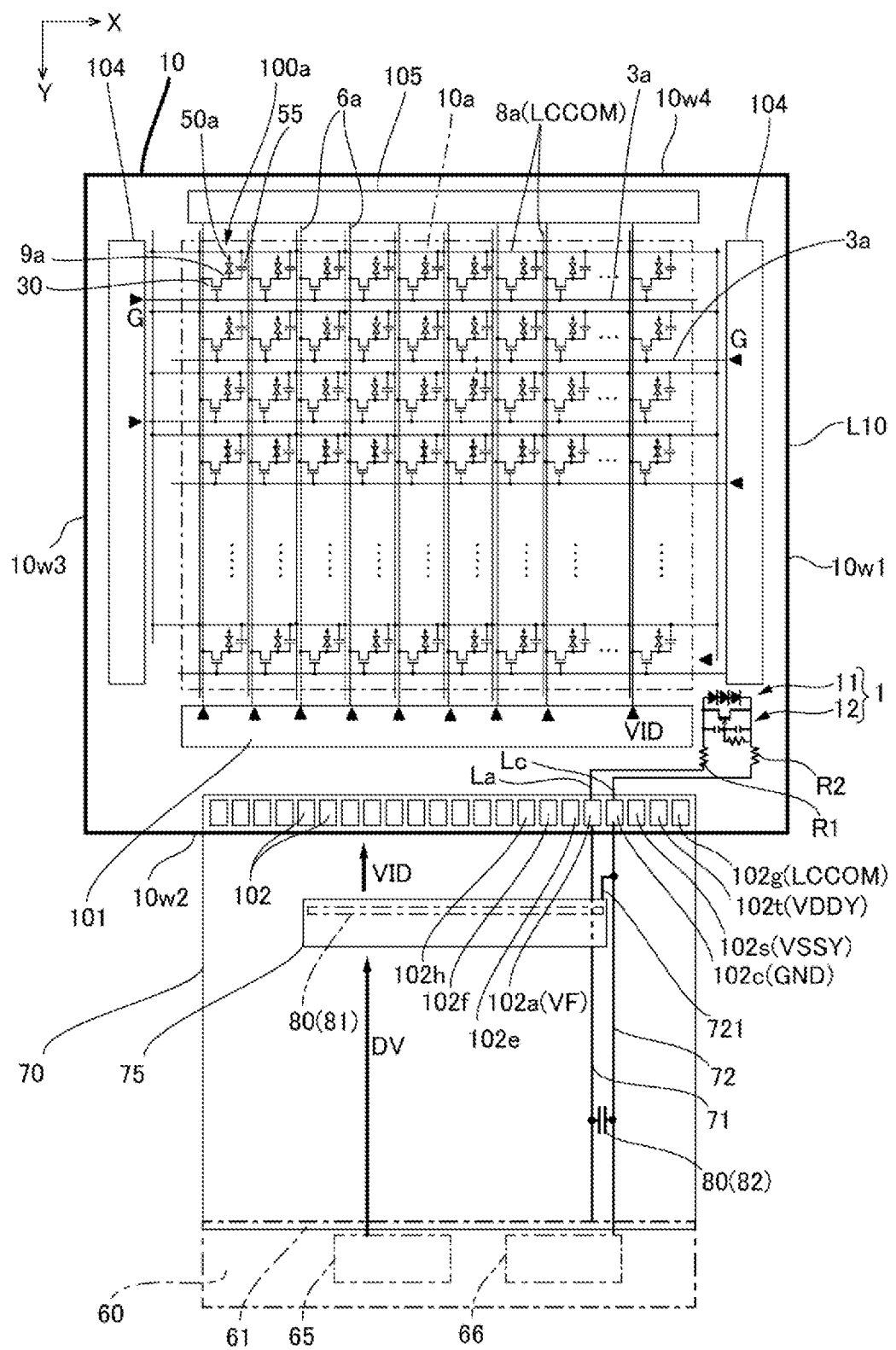
FIG. 9 is an explanatory view of an electro-optical device according to Embodiment 2 of the present disclosure.

FIG. 9 is an explanatory view of the electro-optical device 100 according to Embodiment 2 of the present disclosure. The basic configuration of the present embodiment is similar to that of Embodiment 1. Thus, the common components are denoted by the same reference signs, with description thereof being omitted. As illustrated in FIG. 9, in the present embodiment as well, the wiring substrate 70 is provided with the electrostatic protection circuit 80 as in Embodiment 1. In the present embodiment, the first electrostatic protection circuits 81 provided inside the driving IC 75, and the second electrostatic protection circuit 82 provided outside the driving IC 75 in the wiring substrate 70 are used as the electrostatic protection circuit 80.

As in Embodiment 1, the first electrostatic protection circuits 81 have the configuration described above with reference to FIG. 4. In the present embodiment, the second electrostatic protection circuit 82 is a capacitance element provided at the wiring substrate 70. Both the third wiring 71 and the fourth wiring 72 are electrically connected to the second electrostatic protection circuit 82. More specifically, the capacitance element used in the second electrostatic protection circuit 82 is disposed between the third wiring 71 and the fourth wiring 72 on the connector 61 side of the driving IC 75. Furthermore, one end of the capacitance element used in the second electrostatic protection circuit 82 is electrically connected to the third wiring 71, and the other end of the capacitance element is electrically connected to the fourth wiring 72.

Furthermore, in the electro-optical panel 100$p$, the resistance value of the first resistor unit R1 connected to the first wiring La is greater than the resistance value of the third wiring 71, and the resistance value of the second resistor unit R2 connected to the second wiring Lc is greater than the resistance value of the fourth wiring 72.

According to the electro-optical device 100 configured in this way, in a casein which the electro-optical device 100 is handled with the wiring substrate 70 connected to the electro-optical panel 100$p$, when static electricity invades the third wiring 71 and the fourth wiring 72 from the connector 61 side, the surge caused by static electricity can be mitigated by the first electrostatic protection circuits 81 and the second electrostatic protection circuit 82 provided at the wiring substrate 70. Therefore, the temperature-detecting element 11 provided at the electro-optical panel 100$p$ can be protected.

3. EMBODIMENT 3

Figure 10:
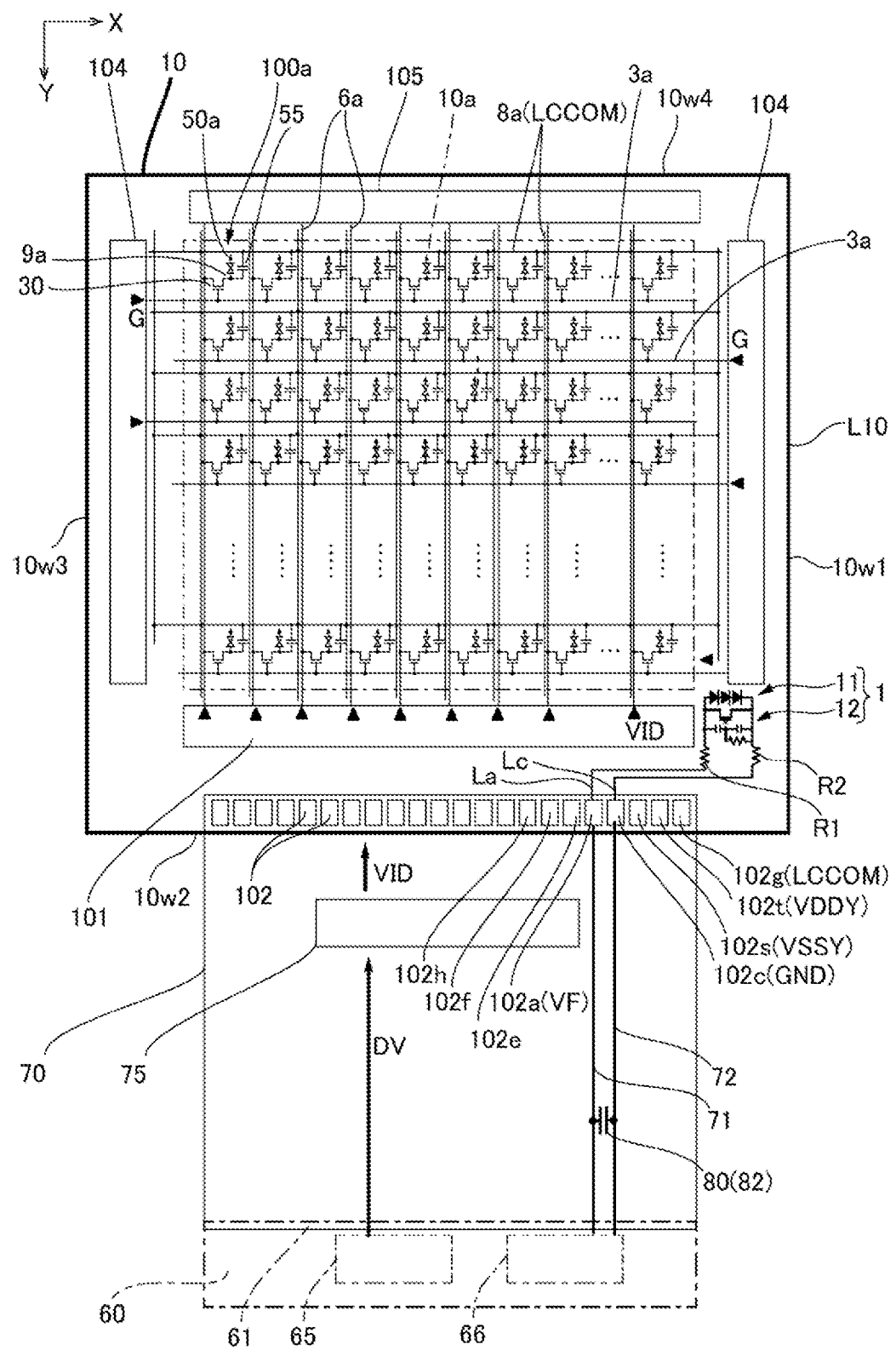
FIG. 10 is an explanatory view of an electro-optical device according to Embodiment 3 of the present disclosure.

FIG. 10 is an explanatory view of the electro-optical device 100 according to Embodiment 3 of the present disclosure. The basic configuration of the present embodiment is similar to that of Embodiment 1. Thus, the common components are denoted by the same reference signs, with description thereof being omitted. As illustrated in FIG. 10, in the present embodiment as well, the wiring substrate 70 is provided with the electrostatic protection circuit 80 as in Embodiment 1. In the present embodiment, the driving IC 75 overlaps neither the third wiring 71 nor the fourth wiring 72 in plan view. Accordingly, the electrostatic protection circuit 80 is the second electrostatic protection circuit 82 provided outside the driving IC 75 in the wiring substrate 70. The second electrostatic protection circuit 82 is a capacitance element provided at the wiring substrate 70 as in Embodiment 2. One end of the capacitance element is electrically connected to the third wiring 71, and the other end of the capacitance element is electrically connected to the fourth wiring 72.

Furthermore, in the electro-optical panel 100p, the resistance value of the first resistor unit R1 connected to the first wiring La is greater than the resistance value of the third wiring 71, and the resistance value of the second resistor unit R2 connected to the second wiring Lc is greater than the resistance value of the fourth wiring 72.

According to the electro-optical device 100 configured in this way, in a casein which the electro-optical device 100 is handled with the wiring substrate 70 connected to the electro-optical panel 100p, when static electricity invades the third wiring 71 and the fourth wiring 72 from the connector 61 side, the surge caused by static electricity can be mitigated by the second electrostatic protection circuit 82 provided at the wiring substrate 70. Therefore, the temperature-detecting element 11 provided at the electro-optical panel 100p can be protected.

Furthermore, the driving IC 75 overlaps neither the third wiring 71 nor the fourth wiring 72 in plan view, and thus the driving IC 75 that is a high-speed signal source is less likely to become a noise source for the third wiring 71 and the fourth wiring 72.

4. EMBODIMENT 4

Figure 11:
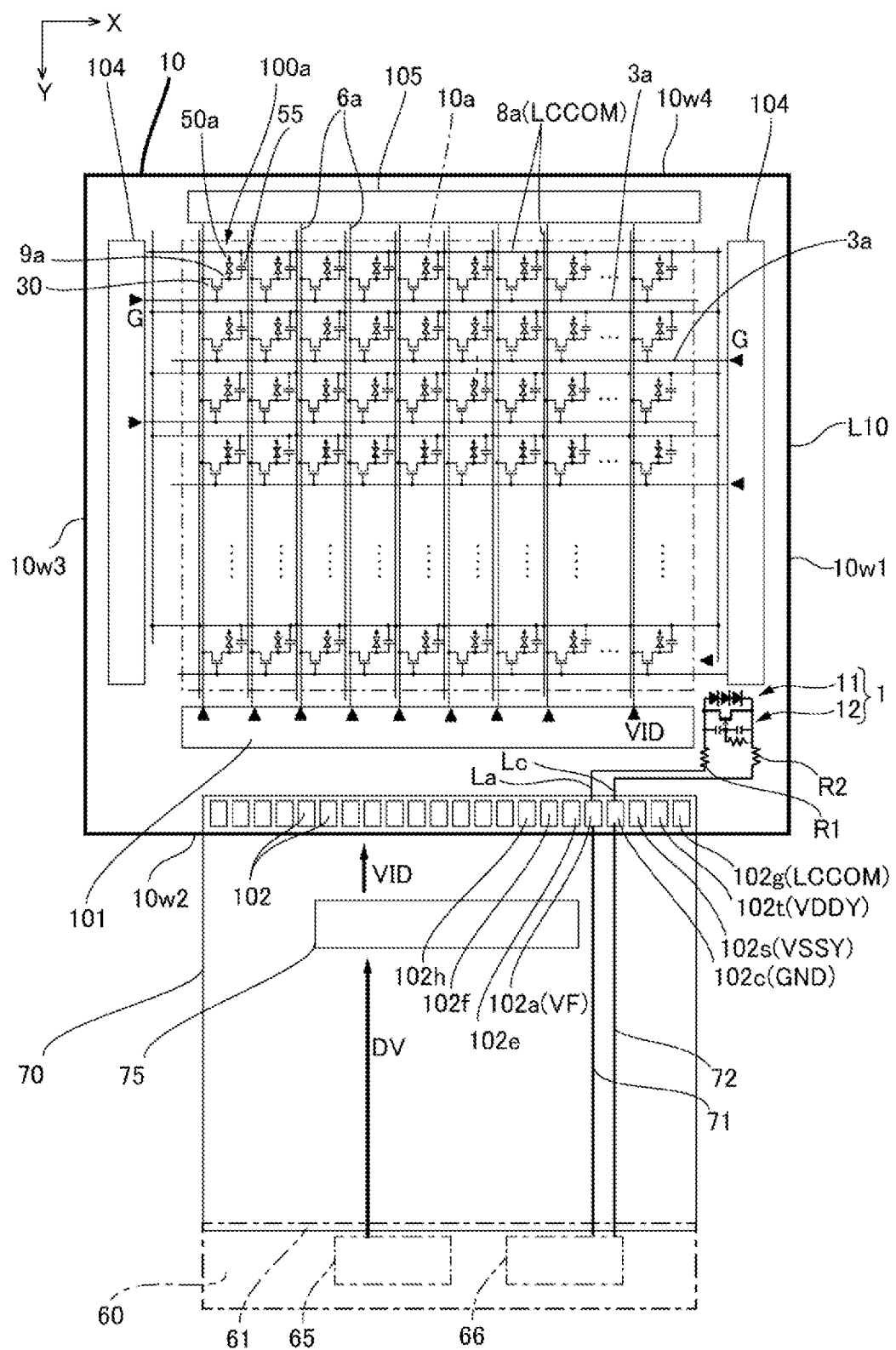
FIG. 11 is an explanatory view of an electro-optical device according to Embodiment 4 of the present disclosure.
Figure 14:
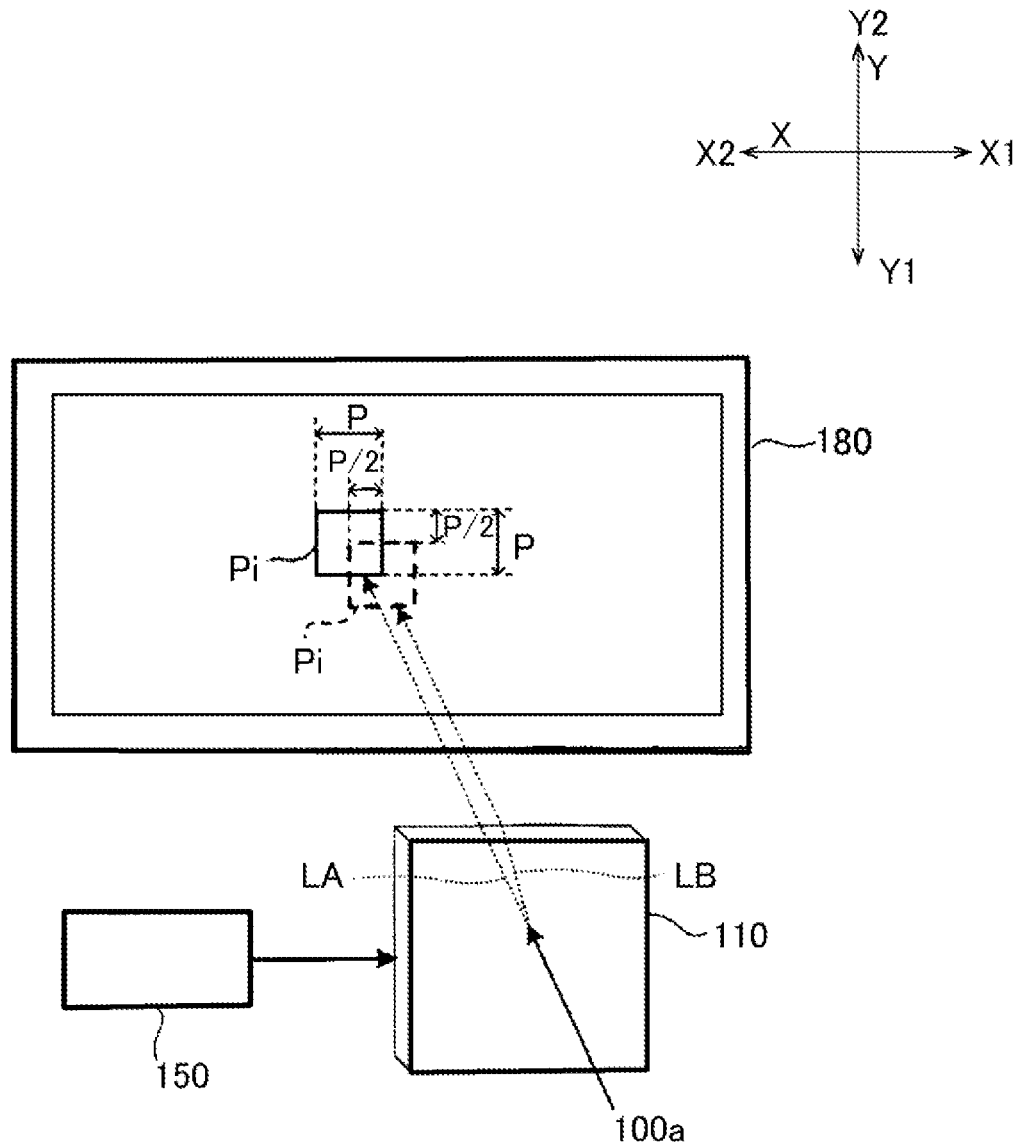
FIG. 14 is an explanatory view of an optical path-shifting element illustrated in FIG. 13.

FIG. 11 is an explanatory view of the electro-optical device 100 according to Embodiment 4 of the present disclosure. The basic configuration of the present embodiment is similar to that of Embodiment 1. Thus, the common components are denoted by the same reference signs, with description thereof being omitted. In FIG. 14, in the present embodiment, the wiring substrate 70 is provided with no electrostatic protection circuit 80. However, the driving IC 75 overlaps neither the third wiring 71 nor the fourth wiring 72 in plan view, and thus the driving IC 75 that is a high-speed signal source is less likely to become a noise source for the third wiring 71 and the fourth wiring 72.

5. EMBODIMENT 5

Figure 12:
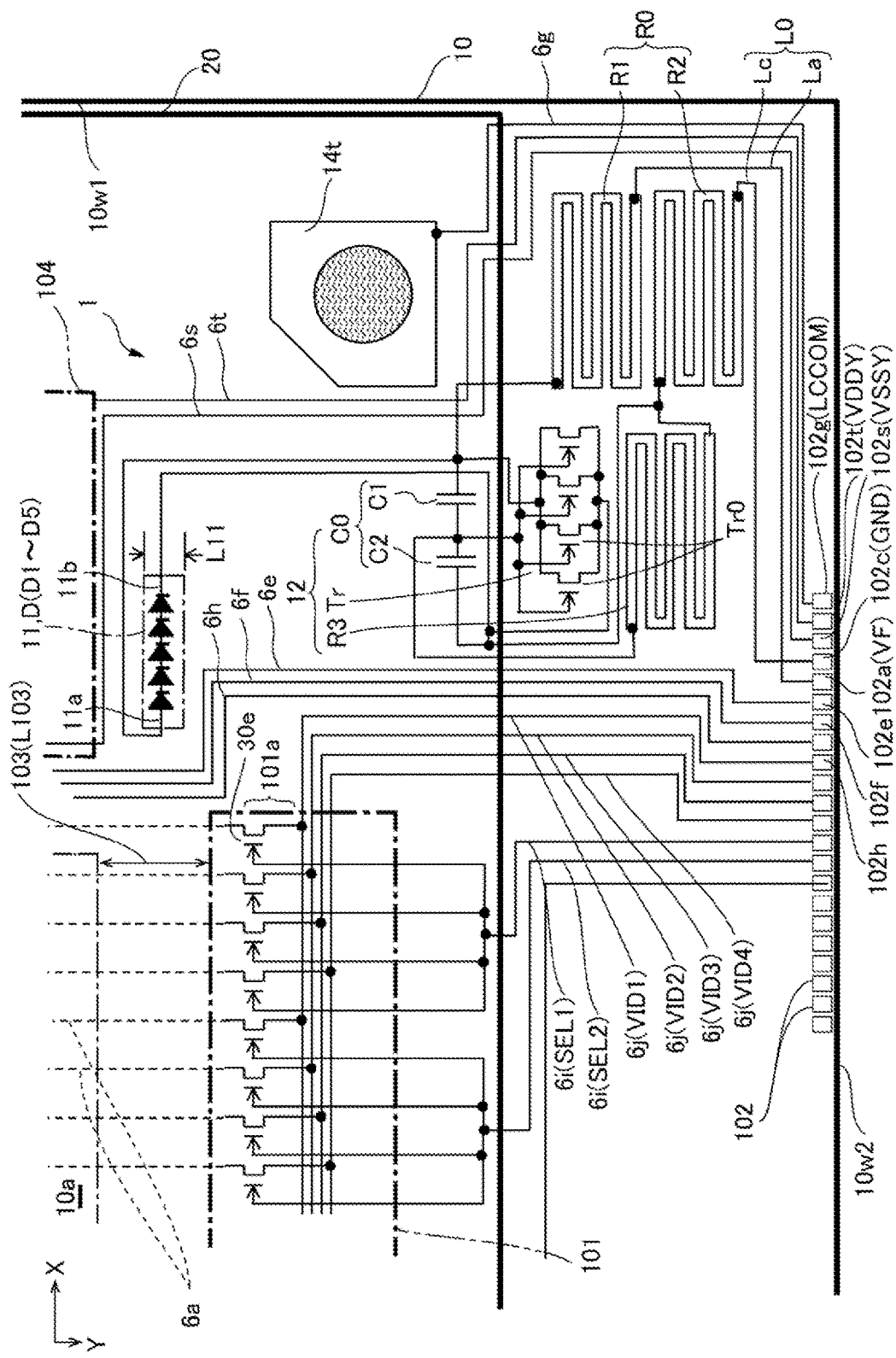
FIG. 12 is an explanatory view of an electro-optical device according to Embodiment 5 of the present disclosure.

FIG. 12 is an explanatory view of the electro-optical device 100 according to Embodiment 5 of the present disclosure. Note that the basic configuration of the present embodiment is similar to that of Embodiment 1. Thus, the common components are denoted by the same reference signs, with description thereof being omitted. In Embodiment 1, in the data line driving circuit 101, the control signal wiring 6i extending in the second direction X is disposed in parallel with each other in the first direction Y. However, as illustrated in FIG. 12, the present disclosure may be applied to an electro-optical device 100 in which the image signal wiring 6j extending in the second direction X is disposed in parallel with each other in the first direction Y.

6. OTHER EMBODIMENTS OF ELECTRO-OPTICAL DEVICE

In the present disclosure, the electro-optical device 100 is not limited to liquid crystal devices. The present disclosure may be applied to electro-optical devices 100 other than liquid crystal devices, such as organic electroluminescence devices.

7. CONFIGURATION EXAMPLE OF ELECTRONIC APPARATUS

Figure 13:
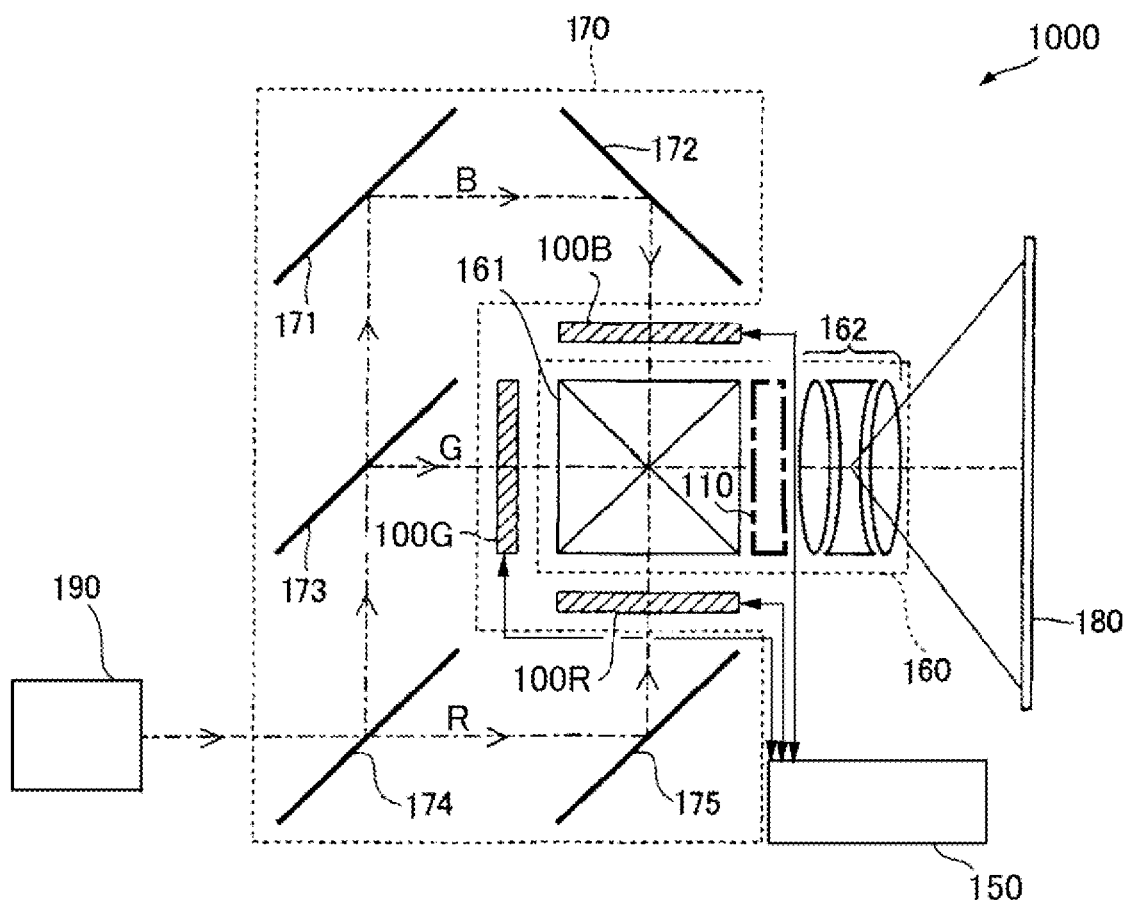
FIG. 13 is a block diagram illustrating a configuration example of a projection-type display device to which the present disclosure is applied.

FIG. 13 is a block diagram illustrating a configuration example of a projection-type display device 1000 to which the present disclosure is applied. FIG. 14 is an explanatory view of an optical path-shifting element 110 illustrated in FIG. 13. Note that in FIG. 13, illustration of polarizing plates and the like is omitted. The projection-type display device 1000 illustrated in FIG. 13 is an example of an electronic apparatus to which the present disclosure is applied. The projection-type display device 1000 includes an illumination device 190, a separation optical system 170, three electro-optical devices 100R, 100G, and 100B, and a projection optical system 160. The electro-optical devices 100R, 100G, and 100B each includes an electro-optical device 100 described above with reference to FIGS. 1 to 12.

The illumination device 190 is a white light source, and a laser light source or a halogen lamp is used therefor, for example. The separation optical system 170 includes three mirrors 171, 172, and 175, as well as dichroic mirrors 173 and 174. The separation optical system 170 separates white light emitted from the illumination device 190 into three primary colors of red (R), green (G), and blue (B). Specifically, the dichroic mirror 174 transmits light of the wavelength region of red (R), and reflects light of the wavelength regions of green (G) and blue (B). The dichroic mirror 173 transmits light of the wavelength region of blue (B), and reflects light of the wavelength region of green (G). Light corresponding to red (R), green (G), and blue (B) is guided to the electro-optical devices 100R, 100G, and 100B, respectively.

Light modulated by the electro-optical devices 100R, 100G, and 100B is incident on a dichroic prism 161 from three directions. The dichroic prism 161 constitutes a synthesis optical system in which images of red (R), green (G), and blue (B) are synthesized. Accordingly, a projection lens system 162 can magnify and project a synthesized image emitted from the optical path-shifting element 110 to a projection member such as a screen 180 to display a color image on the projection member such as the screen 180.

At this time, a control unit 150 can correct image signals supplied to the electro-optical devices 100R, 100G, and 100B based on temperature detection results of the temperature-detecting circuit 1. Therefore, even when the environmental temperature or the like fluctuates, a high quality projection image can be displayed. Furthermore, when a configuration is employed in which a technology of providing the optical path-shifting element 110 indicated by a dot-dash line in the projection optical system 160 on the light emission side of the dichroic prism 161 and shifting the position at which a projected pixel is visually recognized every predetermined period is used to enhance resolution, it becomes necessary to drive the liquid crystal layer at high speed. Even in this case, employing a configuration in which image signals supplied to the electro-optical devices 100R, 100G, and 100B are corrected based on temperature detection results of the temperature-detecting circuit 1 or a configuration in which the temperature of the electro-optical panels 100p of the electro-optical devices 100R, 100G, and 100B is adjusted based on temperature detection results of the temperature-detecting circuit 1 can drive the electro-optical layer 50 including a liquid crystal layer at high speed.

As illustrated in FIG. 14, the optical path-shifting element 110 is an optical element that shifts the light emitted from the dichroic prism 161 in a preset direction. FIG. 14 illustrates a state in which the position of a projected pixel Pi, at which the light emitted from each of the pixel circuits 100a of the electro-optical panel 100p is visually recognized, is shifted to one side X1 in the X direction by a distance corresponding to 0.5 pixel pitch (which is equal to P/2), and to one side Y1 in the Y direction by a distance corresponding to 0.5 pixel pitch (which is equal to P/2) by the optical path-shifting element 110. The optical path-shifting element 110 includes a light-transmitting plate. Under the command of the control unit 150, an actuator causes the light-transmitting plate to swing about one or both of an axial line extending in the Y direction or an axial line extending in the X direction, thereby shifting the optical path of the light emitted from each of the pixel circuits 100a of the electro-optical panel 100p to an optical path LA and an optical path LB.

8. OTHER EMBODIMENTS OF ELECTRONIC APPARATUS

A projection-type display apparatus may be configured to use an LED light source or the like that emits light of various colors as a light source unit, and supply each colored light emitted from such an LED light source to another liquid crystal device.

Electronic apparatuses including the electro-optical device 100 to which the present disclosure is applied are not limited to the projection-type display device 1000 of the above-described embodiment. For example, the electro-optical device 100 to which the present disclosure is applied may be used in electronic apparatuses such as a headup display (HUD), a head-mounted display (HMD), a personal computer, a digital still camera, and a liquid crystal television.

What is claimed is:

1. An electro-optical device comprising:
   an electro-optical panel provided with
      a temperature-detecting element,
      a first wiring electrically connected to the temperature-detecting element, and
      a second wiring electrically connected to the temperature-detecting element; and
   a wiring substrate provided with
      a third wiring electrically connected to the first wiring,
      a fourth wiring electrically connected to the second wiring,
      an electrostatic protection circuit, and
      a driving integrated circuit provided with a driving circuit, wherein
   the electrostatic protection circuit is provided at the wiring substrate and is electrically connected to at least one of the third wiring and the fourth wiring,
   the electrostatic protection circuit includes a first electrostatic protection circuit and a second electrostatic protection circuit,
   the first electrostatic protection circuit is provided inside the driving integrated circuit and is electrically connected to at least one of the third wiring and the fourth wiring, and
   the second electrostatic protection circuit is provided at the wiring substrate and is electrically connected to the third wiring and the fourth wiring.

2. The electro-optical device according to claim 1, wherein
   the electrostatic protection circuit is provided inside the driving integrated circuit and
   at least one of the third wiring and the fourth wiring is electrically connected to the electrostatic protection circuit.

3. The electro-optical device according to claim 2, wherein
   the first wiring includes a first resistor unit,
   the second wiring includes a second resistor unit,
   a resistance value of the first resistor unit is greater than a resistance value of the third wiring, and
   a resistance value of the second resistor unit is greater than a resistance value of the fourth wiring.

4. The electro-optical device according to claim 2, wherein the electrostatic protection circuit is electrically connected to a power clamper circuit provided inside the driving integrated circuit.

5. The electro-optical device according to claim 2, wherein at least one of the third wiring and the fourth wiring is provided so as to overlap the driving integrated circuit in plan view.

6. The electro-optical device according to claim 1, wherein the electrostatic protection circuit is provided at the wiring substrate and is electrically connected to the third wiring and the fourth wiring.

7. The electro-optical device according to claim 6, wherein
   the electrostatic protection circuit is a capacitance element provided at the wiring substrate,
   one end of the capacitance element is electrically connected to the third wiring, and
   the other end of the capacitance element is electrically connected to the fourth wiring.

8. The electro-optical device according to claim 1, wherein
   the first wiring includes a first resistor unit,
   the second wiring includes a second resistor unit,
   a resistance value of the first resistor unit is higher than a resistance value of the third wiring, and
   a resistance value of the second resistor unit is higher than a resistance value of the fourth wiring.

9. The electro-optical device according to claim 1, wherein the first electrostatic protection circuit is electrically connected to a power clamper circuit provided inside the driving integrated circuit.

10. The electro-optical device according to claim 1, wherein at least one of the third wiring and the fourth wiring is provided so as to overlap the driving integrated circuit in plan view.

11. The electro-optical device according to claim 1, wherein
    the second electrostatic protection circuit is a capacitance element provided at the wiring substrate,
    one end of the capacitance element is electrically connected to the third wiring, and
    the other end of the capacitance element is electrically connected to the fourth wiring.

12. An electro-optical device comprising:
    an electro-optical panel provided with
       a temperature-detecting element,
       a first wiring electrically connected to the temperature-detecting element, and a second wiring electrically connected to the temperature-detecting element; and a wiring substrate provided with
a third wiring electrically connected to the first wiring,
a fourth wiring electrically connected to the second wiring,
an electrostatic protection circuit, and
a driving integrated circuit; wherein the third wiring and the fourth wiring do not overlap the driving integrated circuit in plan view, the electrostatic protection circuit is provided at the wiring substrate and is electrically connected to the third wiring and the fourth wiring, the electrostatic protection circuit includes a first electrostatic protection circuit and a second electrostatic protection circuit, the first electrostatic protection circuit is provided inside the driving integrated circuit and is electrically connected to at least one of the third wiring and the fourth wiring, and the second electrostatic protection circuit is provided at the wiring substrate and is electrically connected to the third wiring and the fourth wiring.

13. The electro-optical device according to claim 12, wherein the electrostatic protection circuit is a capacitance element provided at the wiring substrate, one end of the capacitance element is electrically connected to the third wiring, and the other end of the capacitance element is electrically connected to the fourth wiring.

14. The electro-optical device according to claim 1, wherein the electro-optical panel is provided with a third electrostatic protection circuit.

15. The electro-optical device according to claim 14, wherein the electro-optical panel includes
a first substrate including a first side extending in a first direction and a second side extending in a second direction intersecting the first direction and
a second substrate facing the first substrate, the first substrate includes
a scanning line driving circuit disposed along the first direction and
an inter-substrate conduction electrode that is disposed between the scanning line driving circuit and the second side and that is configured to establish conduction between the first substrate and the second substrate, and the third electrostatic protection circuit is disposed between the inter-substrate conduction electrode and the second side.

16. An electronic apparatus comprising the electro-optical device according to claim 1.

* * * * *